United States Patent

Murakami et al.

[11] Patent Number: 5,843,293
[45] Date of Patent: Dec. 1, 1998

[54] ARC-TYPE EVAPORATOR

[75] Inventors: Hiroshi Murakami; Tadashi Kitagawa; Haruo Hiratsuka; Takaya Ishii; Koji Okamoto; Akira Doi, all of Kyoto, Japan

[73] Assignee: Nissin Electric Co., Ltd., Kyoto, Japan

[21] Appl. No.: 589,254

[22] Filed: Jan. 23, 1996

[30] Foreign Application Priority Data

Jan. 23, 1995 [JP] Japan ...................................... 7-27524

[51] Int. Cl.⁶ .................................................. C23C 14/22
[52] U.S. Cl. ................................ 204/298.41; 204/192.38
[58] Field of Search ........................... 204/192.38, 298.41

[56] References Cited

U.S. PATENT DOCUMENTS

| | | | |
|---|---|---|---|
| 3,793,179 | 2/1974 | Sablev et al. ........................... | 204/298 |
| 3,836,451 | 9/1974 | Snaper ................................. | 204/298.41 |
| 4,556,471 | 12/1985 | Bergman et al. ....................... | 204/298 |
| 4,724,058 | 2/1988 | Morrison, Jr. .................. | 204/298.41 X |
| 4,929,322 | 5/1990 | Sue et al. ........................... | 204/192.38 |
| 5,160,595 | 11/1992 | Hauger et al. ................. | 204/298.41 X |

FOREIGN PATENT DOCUMENTS

| | | |
|---|---|---|
| 87 03 520 | 10/1987 | Germany . |
| 61-41764 | 2/1986 | Japan . |
| 63-18056 | 1/1988 | Japan . |
| 1-042574 | 2/1989 | Japan . |
| 1-263265 | 10/1989 | Japan . |
| 2 234 265 | 1/1991 | United Kingdom . |

*Primary Examiner*—Nam Nguyen
*Attorney, Agent, or Firm*—Finnegan, Henderson, Farabow, Garrett & Dunner, L.L.P.

[57] ABSTRACT

The arc-type evaporator of the present invention includes an anode and a cathode for generating arc discharging, a trigger electrode and a gas supply pipe. The trigger electrode is contacted with the cathode to cause a first spark, and thereafter is separated from the cathode to occur the arc discharge between the anode and the cathode. The gas supply pipe is provided independently of the trigger electrode, and supplies the cathode a reactive gas which reacts with a substance forming the cathode to produce a chemical compound. The gas supply pipe includes a gas blow-out port formed in the neighborhood of the side portion or rear side portion of the cathode to face the cathode. The reactive gas is supplied from the gas blow-out port to an area including the front surface of the cathode.

8 Claims, 6 Drawing Sheets

ARC-TYPE EVAPORATOR

BACKGROUND OF THE INVENTION

1. Field of the Invention

The present invention relates to an arc-type evaporator using an arc discharge in a cathode thereof, which is used in a vacuum arc evaporation equipment for evaporating a cathode substance onto a base member to form a thin film, a thin film forming equipment for evaporating a cathode substance onto a base member and irradiating ions onto the base member in combination to form a thin film, or other similar equipment.

2. Description of the Related Art

A method of using an arc-type evaporator of this kind to form a thin film on the surface of a base member with a bias voltage applied thereto is referred to as an arc-type ion plating method, which is advantageous in the close contact and productivity of the film but is poor in the surface roughness of a film to be formed that is, the degree of the unevenness of the film surface is great and is thus poor in flatness and smoothness.

In the arc-type evaporator, the cathode surface is locally heated up to high temperatures by the arc discharge and the heated cathode surface portion is thereby melted so that the cathode substance is caused to evaporate. In this action, together with a fine cathode substance, large lumps of cathode substances are also evaporated and attach to the surface of the base material to worsen the surface roughness of the film formed.

In view of the above circumstances, Unexamined Japanese Patent Publication (kokai) No. Sho. 63-18056 discloses an arc-type evaporator which can solve the above problem.

That is, as shown in FIG. 10, in this arc-type evaporator 10, there is used a pipe-shaped trigger electrode 30, and, while a reactive gas 36 is being supplied from the gas blow-out port 32 of the trigger electrode 30 to the surface 12a of a cathode 12, arc discharge is generated between the cathode 12 and a vacuum container 22 serving also as the anode of the evaporator 10, thereby causing a cathode substance 14 to evaporate. The reactive gas 36 is a gas which reacts with a substance forming the cathode 12 to produce a chemical compound.

In this evaporation, while an arc is being ignited, the trigger electrode 30 is driven mechanically through a field-through member 34 in a direction of an arrow A shown in FIG. 10. The cathode 12 is mounted on a flange 16 and an arc power source 24 is connected between the flange 16 and vacuum container 22. In the periphery of the cathode 12, there is disposed a shield plate 26 which is used to spread the arc. In FIG. 10, reference numeral 18 designates a magnet; 20, an insulation member; and 28 and 38 respectively, resistors.

When arc discharge is generated in the cathode 12 while supplying the reactive gas 36 from the gas blow-out port 32 of the trigger electrode 30 to the front surface 12a of the cathode 12, then the reactive gas 36 and the substance forming the cathode 12 react with each other to produce a chemical compound having a high melting point in the front surface 12a of the cathode 12, so that a large number of cathode points due to arc discharge are produced on the front surface 12a of the cathode 12 and an arc current can be thereby distributed to the large number of cathode points. As a result of this, the cathode substance 14 to be evaporated from the respective cathode points is made fine in size to thereby be able to prevent production of large lumps of cathode substances.

In the above-mentioned conventional arc-type evaporator 10, since the trigger electrode 30 serves also as a gas supply pipe and the gas blow-out port 32 formed in the leading end portion of the trigger electrode 30 is always situated in front of the cathode 12, as the arc-type evaporator 10 is used, the cathode substances 14 attach to the gas blow-out port 32 to thereby stop it up. This makes it difficult to supply the reactive gas 36 stably and, therefore, the trigger electrode 30 must be replaced frequently.

It takes a given time to replace the trigger electrode 30 with a new one and the arc-type evaporator 10 cannot be used during the replacement of the trigger electrode 30, with the result that the productivity of the thin films is lowered accordingly. Also, if the trigger electrode 30 with the gas blow-out port 32 stopped up is left unreplaced, then the reactive gas 36 cannot be supplied sufficiently to the front surface 12a of the cathode 12, which results in the large lumps of cathode substances 14. As a result of this, it is impossible to obtain a thin film which has a good surface roughness (that is, which is flat and smooth in the surface thereof).

SUMMARY OF THE INVENTION

It is an object of the invention to provide an arc-type evaporator which does not need to replace parts such as a trigger electrode and the like to thereby prevent evaporation of the large lumps of cathode substances.

The arc-type evaporator of the present invention is comprised of: an anode and a cathode for generating arc discharge; a trigger electrode which is contacted with the cathode to cause a first spark and thereafter separated from the cathode to occur the arc discharge between the anode and the cathode; and a gas supply pipe provided independently of the trigger electrode, for supplying the cathode a reactive gas which reacts with a substance forming the cathode to produce a chemical compound, the gas supply pipe including a gas blow-out port formed in the neighborhood of the side portion or rear side portion of the cathode to face the cathode; wherein the reactive gas is supplied from the gas blow-out port to an area including the front surface of the cathode.

According to the arc-type evaporator of the present invention, since the reactive gas is supplied to the area including the front surface of the cathode from the gas blow-out port of the gas supply pipe, it is possible to prevent large lumps of cathode substances from evaporating. This eliminates the need that the trigger electrode is made in a pipe-like shape and the reactive gas is supplied from the pipe-shaped trigger electrode, thereby solving the problem that the leading end portion of the trigger electrode can be stopped up with the cathode substances. Also, since the gas blow-out port of the gas supply pipe is situated in the neighborhood of the side portion or rear side portion of the cathode, avoiding the position in front of the cathode, there is a small possibility that the cathode substances evaporated from the front surface of the cathode due to the arc discharge can attach to the gas blow-out port and stop it up.

Therefore, the reactive gas can be supplied stably with no need to replace the trigger electrode and gas supply pipe and also evaporation of large lumps of cathode substances can be prevented. Also, according to the present arc-type evaporator, it is possible to reduce not only the time necessary for maintenance but also the number of parts to be replaced. Further, when the present arc-type evaporator is used in producing a thin film, a thin film having a good surface roughness can be produced stably with no need for replacement of parts such as the trigger electrode, gas supply pipe and the like, thereby being able to improve the productivity of the thin film.

BRIEF DESCRIPTION OF THE DRAWINGS

In the accompanying drawings.

PREFERRED EMBODIMENTS OF THE INVENTION

Preferred embodiments of the present invention will be described referring to the accompanying drawings as follows.

Figure 1:
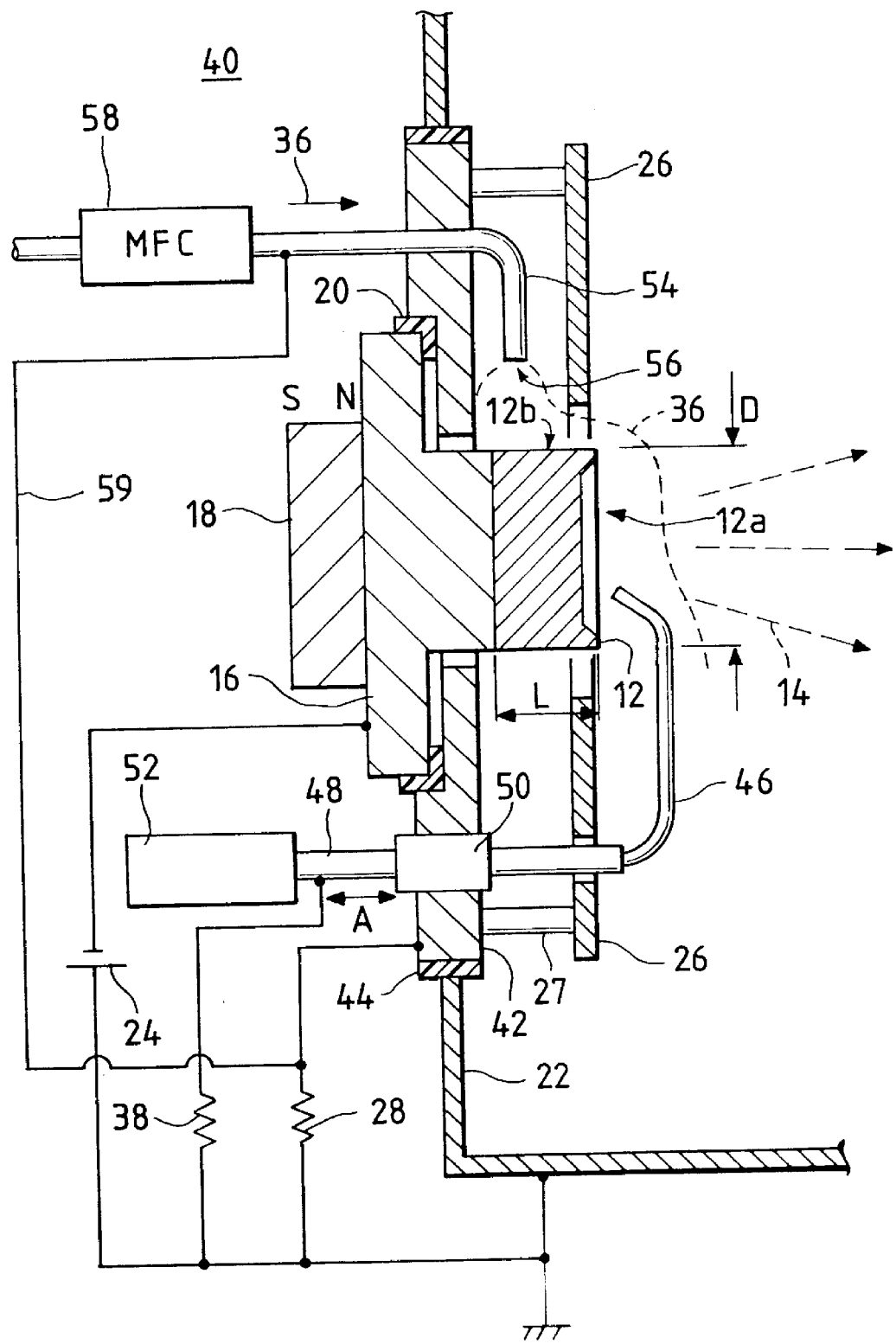
FIG. 1 is a section view of an embodiment of an arc-type evaporator according to the invention.
Figure 10:
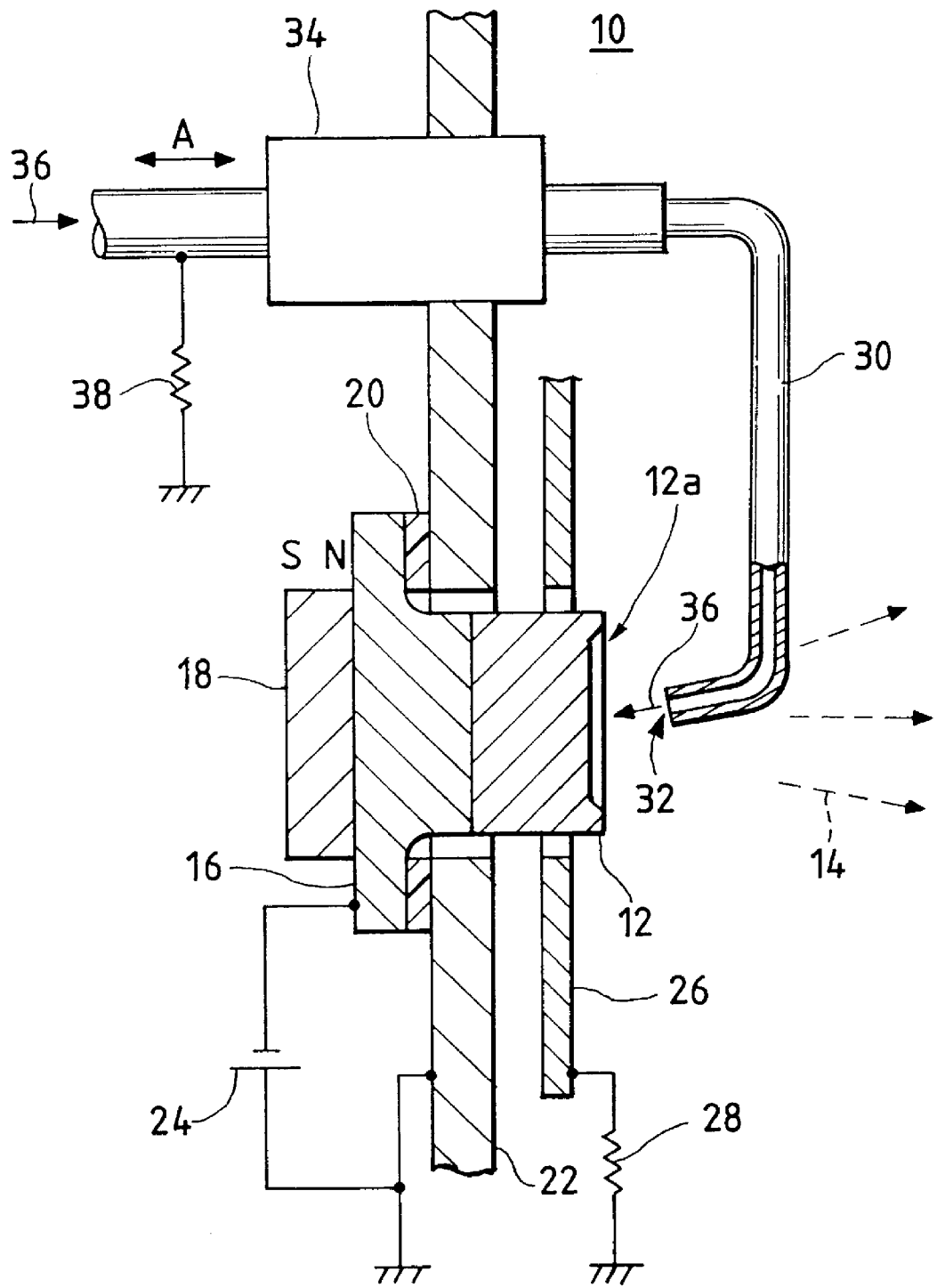
FIG. 10 is a section view of an embodiment of a conventional arc-type evaporator.

FIG. 1 is a section view of an embodiment of an arc-type evaporator according to the invention. In FIG. 1, the same or equivalent parts as in the conventional arc-type evaporator shown in FIG. 10 are given the same designations and thus description will be given below mainly of differences between the present arc-type evaporator and the conventional arc-type evaporator.

In an arc-type evaporator 40 according to the present embodiment, unlike the conventional arc-type evaporator 10, a trigger electrode 46 does not serve as a gas supply pipe but performs only the function of a trigger electrode and, whereas there is disposed a gas supply pipe 54 which supplies the above-mentioned reactive gas 36 to the cathode 12. The gas supply pipe 54 includes in the leading end portion thereof a plurality of gas blow-out ports 56 which are respectively situated in the neighborhood of the side portion or rear side portion of the cathode 12 in such a manner that they face the cathode 12. The reactive gas 36 is supplied to an area including the front surface 12a of the cathode 12.

The cathode 12 is formed of a desired metal such as Zr, Hf, Nb, Ta, V, W, Cr, Mo, Al, Cu, Si, and typically formed of Ti.

The reactive gas 36 may react with a substance forming the cathode 12 to produce a chemical compound and, more particularly, a chemical compound which has a melting point higher than that of the cathode substance; for example, the reactive gas 36 may be nitrogen gas, hydrocarbon gas, oxygen gas or the like. In a typical example, the cathode 12 is formed of titanium and the reactive gas 36 is nitrogen gas and, in this case, titanium and nitrogen gases combine with each other to make titanium nitride (TiN).

The reactive gas 36 is supplied to the gas supply pipe 54 through a mass flow controller 58 from a gas supply source (not shown).

The cathode 12 is mounted on a flange 16 which is formed of non-magnetic metal, while the flange 16 is mounted through an insulation member 20 on a mounting plate 42. The mounting plate 42 is also formed of non-magnetic metal.

In the back surface portion of the flange 16, there is mounted a magnet (in particular, a permanent magnet) 18 which produces a magnetic field to control the condition of an arc in the neighborhood of the front surface of the cathode 12.

The mounting plate 42 is mounted through an insulation member 44 on a vacuum container 22 which serves also as the anode of the evaporator 40. In the present embodiment, the vacuum container 22 is grounded.

To the flange 16, that is, between the cathode 12 and vacuum container 22, there is connected a DC arc power source 24 with the cathode 12 side thereof as a negative side thereof.

The trigger electrode 46 is mounted to the leading end portion of a shaft 48 extending through the mounting plate 42 through a field-through member 50, and the trigger electrode 46 can be driven by a drive device 52 in the back-and-forth direction of the cathode 12 as shown by an arrow A. To the shaft 48, that is, between the trigger electrode 46 and vacuum container 22, there is connected a resistor 38 which is used to limit a current while the arc is being ignited.

The periphery of the side portion of the cathode 12 is covered with a ring-shaped shield plate 26 in order to spread the arc, that is, in order to execute arc discharge between the cathode 12 and the vacuum container 22 which is spaced a certain distance apart from the cathode 12. The shield plate 26 is connected to the vacuum container 22 through a support member 27 and a resistor 28. In the present embodiment, the shield plate 26 is also formed of non-magnetic metal.

The gas supply pipe 54 is connected to the mounting plate 42 by a conductor 59 and is set to have the same potential as the shield plate 26. This can prevent abnormal discharge from occurring between the cathode 12 and gas supply pipe 54. In particular, with use of this arrangement, since the resistor 28 is present between the positive side (that is, the side of the vacuum container 22 serving also as the anode of the evaporator 40) of the arc power source 24 and the gas supply pipe 54, even if discharge is going to occur from the cathode 12 to the gas supply pipe 54, such discharge is prevented by the resistor 28.

In the present arc-type evaporator 40, after the trigger electrode 46 is contacted with the front surface 12a of the cathode 12 to cause a first spark to occur, if the trigger electrode 46 is separated from the cathode 12, then arc discharge occurs between the front surface 12a of the cathode 12 and the vacuum container 22 serving also as the anode of the evaporator 40, and the arc discharge continues, which melts the front surface 12a of the cathode 12 so that the cathode substance 14 is caused to evaporate from the molten portion.

At the same time, if arc discharge is produced in the cathode 12 while the reactive gas 36 is being supplied from the gas blow-out ports 56 of the gas supply pipe 54 to the area including the front surface 12 of the cathode 12, then the reactive gas 36 reacts with the substance forming the cathode 12 to make a chemical compound having a high melting point on the front surface 12a of the cathode 12. For these reasons, a large number of cathode points due to the arc discharge are produced on the front surface 12a of the cathode 12 so that the arc current can be dispersed to the large number of cathode points. As a result of this, the cathode substances 14 evaporating from the respective cathode points become fine in size to thereby be able to prevent large lumps of the cathode substances 14 from being produced or evaporated.

As described above, in the present arc-type evaporator 40, unlike the conventional arc-type evaporator 10, it is not necessary to make the trigger electrode 46 in a pipe shape and thus to supply the reactive gas from the pipe-shaped trigger electrode and, therefore, there is eliminated the problem that the leading end portion of the trigger electrode can be stopped up with the cathode substances 14.

Also, since the gas blow-out port 56 of the gas supply pipe 54 are situated in the neighborhood of the side portion or rear side portion of the cathode 12 avoiding a position in front of the cathode 12, there is a small possibility that the cathode substance 14 evaporating from the front surface 12a of the cathode 12 can attach to the gas blow-out port 56 to thereby stop it up.

Therefore, the reactive gas can be supplied stably with no need to replace the trigger electrode 46 and gas supply pipe 54, thereby being able to prevent large lumps of the cathode substances 14 from evaporating.

Also, as there are eliminated operations such as the part replacement, cleaning of the gas blow-out port 56 and the like, the time necessary for the maintenance of the arc-type evaporator can be reduced as well as the number of replacement parts can be reduced.

Further, when the present arc-type evaporator 40 is used in producing a thin film, a thin film having a surface roughness as good as the conventional arc-type evaporator 10 can be formed stably with no need to replace the parts such as the trigger electrode 46, gas supply pipe 54 and the like. This reduces the frequency of the stops of the arc-type evaporator 40 due to the replacement of the parts, thereby enhancing the productivity of the film production.

Here, if the diameter and length of the cathode 12 are respectively expressed as D and L, the position of the gas blow-out port 56 of the gas supply pipe 54 may be preferably set in a range of 2D (excluding 0) laterally from the front surface 12a of the cathode 12 and in a range of 2L (in this case, including 0) backwardly from the front surface 12a of the cathode 12. In this setting, the reactive gas 36 can be supplied efficiently to the front surface 12a of the cathode 12 from the position avoiding the position in front of the cathode 12, so that the reactive gas 36 from the gas supply pipe 54 can be used efficiently. In addition, more preferably, the position of the gas blow-out port 56 of the gas supply pipe 54 may satisfy relations of $0<Y \leq 2D$ and $-L \leq X \leq L$, where D is the diameter of the cathode, L is the length of the cathode, Y is a distance laterally from the side surface of the cathode and X is a distance backwardly from the front surface of the cathode.

The number of the gas blow-out port 56 to be formed in the gas supply pipe 54 may be one or two or more. If two or more gas blow-out ports 56 are formed, then the reactive gas 36 can be supplied to the front surface 12a of the cathode 12 more uniformly, which can in turn disperse a large number of cathode points on the surface of the cathode more uniformly to thereby be able to prevent the evaporation of large lumps of cathode substances 14 more positively.

Figure 2:
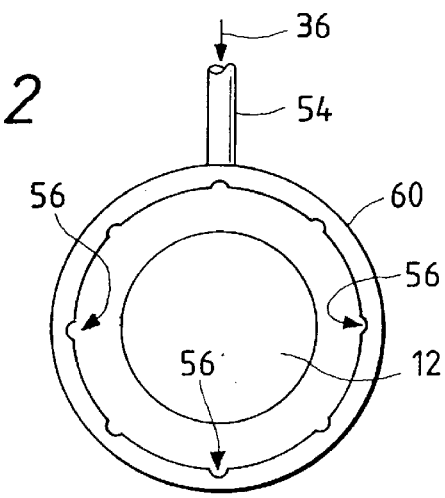
FIG. 2 is a front view of an embodiment of a gas supply pipe including a ring-shaped portion.

As shown in FIG. 2, in the leading end portion of the gas supply pipe 54, there is provided a ring-shaped portion 60 which encircles the periphery of the side portion of the cathode 12 and, in the ring-shaped portion 60, there are dispersively arranged a plurality of gas blow-out ports 56, more preferably, they may be dispersively arranged almost uniformly, which makes it possible to supply the reactive gas 36 to the front surface 12a of the cathode 12 more uniformly. As a result of this, a large number of cathode points can be dispersed more uniformly on the surface of the cathode to thereby be able to prevent the evaporation of the large lumps of cathode substances 14 more positively.

Figure 3:
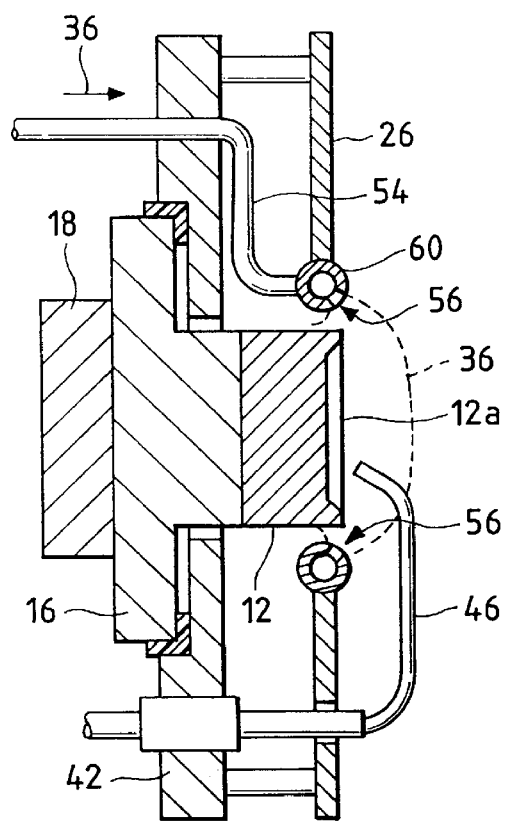
FIG. 3 is a section view of another embodiment of an arc-type evaporator according to the invention.

Alternatively, as shown in FIG. 3, the ring-shaped portion 60 may also be mounted on the inner periphery of the above-mentioned shield plate 26 by welding or by brazing or the like. This can reduce the number of parts to thereby simplify the structure of the arc-type evaporator as well as facilitate the assembling operation of the arc-type evaporator, when compared with a case in which the ring-shaped portion 60 is supported from the mounting plate 42 individually.

It is preferable that, as shown in FIG. 1, a mass flow controller 58 is disposed in the middle of the gas supply pipe 54 to thereby be able to control the total quantity of flow of the reactive gas 36 to be blown out from the gas blow-out ports 56 of the gas supply pipe 54 in the range of 0.01 lit./min.–1 lit./min. That is, if the total flow quantity of the reactive gas 36 is less than 0.01 lit./min., then the reactive gas 36 cannot be supplied sufficiently to the front surface 12a of the cathode 12 and thus the occurrence of the large lumps of cathode substances 14 cannot be prevented effectively. On the other hand, if the total flow quantity of the reactive gas 36 is more than 1 lit./min., then the reactive gas 36 is supplied excessively to thereby worsen the degree of vacuum in the ambience, which raises another harmful problem.

When the gas supply pipe 54 is formed of a conductor such as metal or the like, it is desirable that, as shown in FIG. 1, the gas supply pipe may be electrically connected to the vacuum container 22 serving also as the anode of the arc-type evaporator 40 through the resistor 28. This connection not only can prevent the gas supply pipe 54 from floating electrically but also, for the above-mentioned reason, can prevent the abnormal discharge from occurring between the cathode 12 and gas supply pipe 54. In this case, the conductor 59 itself may also be set to have high resistance. That is, what is important is that the vacuum container 22 serving also as the anode of the evaporator and the gas supply pipe 54 are connected to each other through a resistor.

Alternatively, the gas supply pipe 54 may also be formed of insulation material instead of the conductor such as metal or the like. In this embodiment, there is no fear at all that abnormal discharge can occur between the gas supply pipe 54 and cathode 12 and, therefore, there is eliminated the need to wire the gas supply pipe 54 electrically to other elements by use of the conductor 59 or the like in order to prevent the occurrence of the abnormal discharge.

When the magnet 18 is located in the neighborhood of the back surface of the cathode 12, the gas supply pipe 54 may be preferably formed of non-magnetic material. This eliminates the fear that the magnetic field of the magnet 18 can be disturbed by the gas supply pipe 54 even if the gas supply pipe 54 is located in the neighborhood of the cathode 12, so that the arc can be controlled easily and positively by the magnetic field of the magnet 18. The magnet 18 may be formed of a plurality of N poles and S poles of a plurality of permanent magnets, a magnet in which an N pole and an S pole are arranged concentrically, and three electromagnets of three-phase alternating current (AC).

Figure 4:
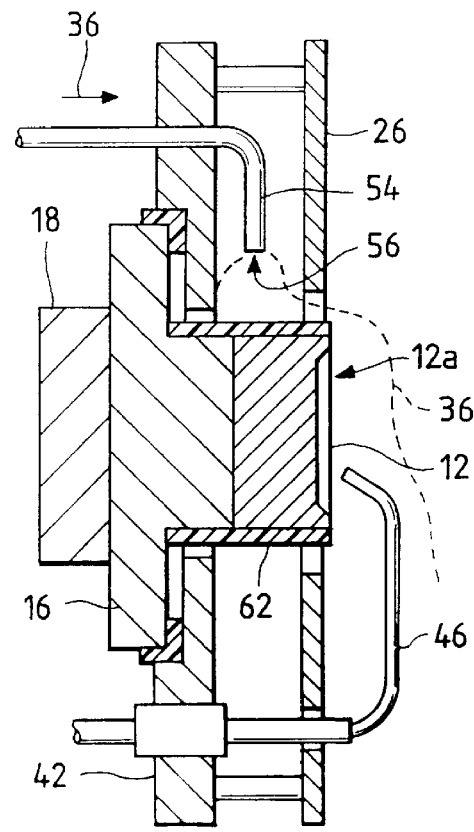
FIG. 4 is a section view of still another embodiment of an arc-type evaporator according to the invention.

Alternatively, in combination with the provision of the above-mentioned gas supply pipe 54, as shown in FIG. 4, the side surface portion of the cathode 12 may be covered with an insulation member 62. In this embodiment, the insulation member 62 is formed in a cylindrical shape. According to this embodiment, it is possible to prevent the occurrence of the abnormal discharge in the side surface portion of the cathode 12 more positively. The insulation member 62 may also be extended forwardly of the front surface 12a of the cathode 12.

Figure 5:
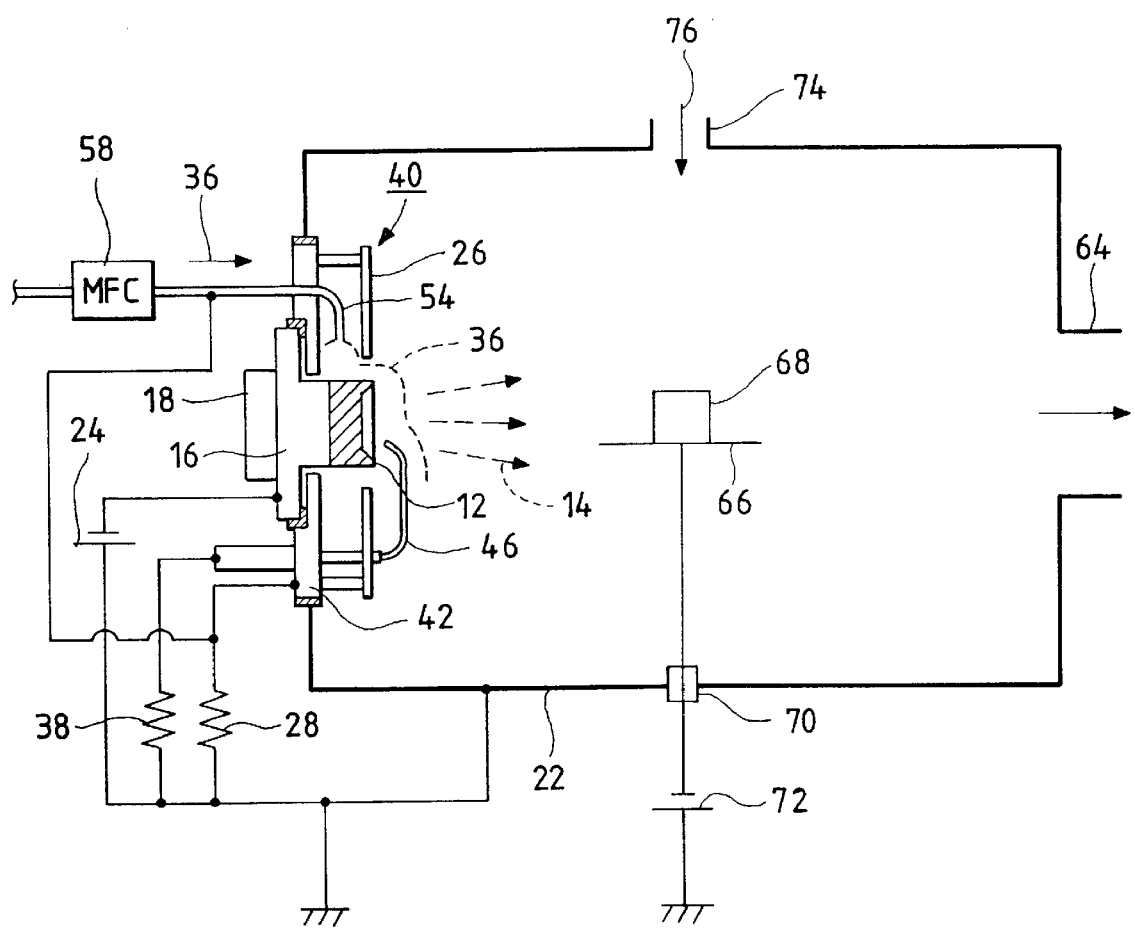
FIG. 5 is a schematic view of an embodiment of a thin film forming equipment incorporating therein an arc-type evaporator shown in FIG. 1.

Now, in FIG. 5, there is shown a schematic view of an embodiment of a thin film forming equipment which incorporates therein the arc-type evaporator 40 shown in FIG. 1. In the present film forming equipment, a holder 66 for holding a base member 68 thereon is disposed within a vacuum container 22 which can be evacuated by a vacuum pump (not shown) through a vacuum exhaust port 64, while the above-mentioned arc-type evaporator 40 is mounted on the side surface portion of the vacuum container 22 in such a manner that it faces the base member 68 held on the holder 66. Similarly to the previously described embodiment, in the present embodiment, the vacuum container 22 serves also as the anode of the arc-type evaporator.

The negative side of a bias power source 72 is connected to the holder 66, which makes it possible to apply a negative bias voltage of, for example, approx. several hundreds of volts to the base member 68 held on the holder 66. In FIG. 5, reference character 70 designates an insulation member.

The vacuum container 22 is structured such that a reactive gas 76 can be introduced from a gas supply source (not shown) through a gas introduction port 74 formed in the wall surface of the vacuum container 22. The reactive gas 76 is of the same kind as the reactive gas 36 to be supplied to the arc-type evaporator 40.

In producing a thin film, after the interior of the vacuum container 22 is evacuated sufficiently (for example, of the order of $10^{-5}$ Torr), the reactive gas 76 is introduced into the vacuum container 22 via the gas introduction port 74 and, at the same time, the reactive gas 36 is supplied to the arc-type evaporator 40, thereby maintaining the interior of the vacuum container 22 at a given pressure (for example, of the order of $10^{-2}$–$10^{-1}$ Torr). Under such condition, while applying such a negative bias voltage as mentioned above to the base member 68 from the bias power source, the arc-type evaporator 40 is operated to thereby cause the cathode substance 14 to evaporate.

Part of the cathode substance 14 that is evaporated by the arc discharge is ionized. The ionized cathode substance 14 is attracted to the base member 68 with the negative bias voltage applied thereto and is thereby caused to collide against the base member 68 and, at the same time, the ionized cathode substance 14 combines with the ambient reactive gas, with the result that a chemical compound thin film is produced on the surface of the base member 68. For example, when the cathode 12 is formed of titanium and the reactive gases 36 and 76 are respectively formed of nitrogen, then there is produced a thin film of titanium nitride.

The film producing method using the above-mentioned equipment is, as described before, referred to as an arc-type ion plating method. According to this method, since the ionized cathode substance 14 can be accelerated toward the base member 68 by the bias voltage, a highly closely contactable thin film can be produced at a high film producing speed (that is, with a high productivity).

Next, description will be given below of a more concrete embodiment in which a thin film was produced using the above-mentioned thin film forming equipment.

In the present embodiment, the cathode 12 was formed of titanium (Ti) with a purity of 3N, the reactive gases 36 and 76 were respectively formed of nitrogen ($N_2$) gas, and a stainless steel flat plate was mounted on the holder 66 as the base member 68. And, after the interior of the vacuum container 22 was evacuated sufficiently down to or lower than $1\times10^{-5}$ Torr, the quantity of flow of the nitrogen gas to be introduced into the vacuum container 22 through the gas introduction port 74 and the quantity of flow of the nitrogen gas to be supplied to the neighborhood of the cathode 12 from the gas supply pipe 54 were respectively controlled to 250cc and 20cc, and a variable valve (not shown) provided in the leading end portion of the vacuum exhaust port 64 was controlled such that the pressure of the interior of the vacuum container 22 could be of the order of 30 m Torr. In this case, the gas blow-out ports 56 of the gas supply pipe 54 were located 1 cm apart from the side surface of the cathode 12, while the quantity of flow of the nitrogen to be blown out from the gas blow-out ports 56 was controlled by the mass flow controller 58.

And, while an arc current (that is, a current which flows in the arc power source 24 during arc discharge) in the arc-type evaporator 40 was set as 70A and a bias voltage to be applied to the base member 68 was set as –200V, arc discharge was executed for one hour to produce a thin film of titanium nitride (TiN) on the surface of the stainless steel flat plate.

Such film production was carried out 10 times using the arc-type evaporator 40 shown in the above embodiment. Also, for the purpose of comparison, using the conventional arc-type evaporator 10 shown in FIG. 10 instead of the arc-type evaporator 40, film production was carried out 10 times under the same conditions as the above experiment using the arc-type evaporator 40.

In FIGS. 6 to 9, there are shown the optical microscopic pictures of the surfaces of the films that were obtained in this manner. The magnifying powers of the pictures are respectively 400.

Figure 6:
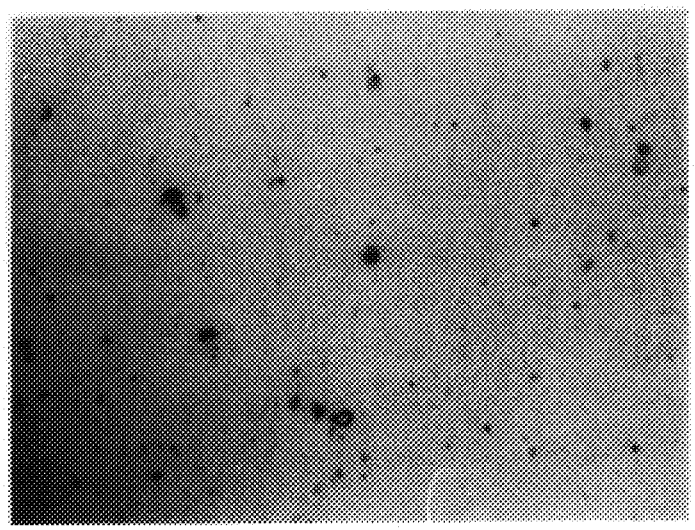
FIG. 6 is an optical microscopic picture of the surface of a film that is formed at the first time using an arc-type evaporator according to the invention, where the magnifying power thereof is 400.
Figure 7:
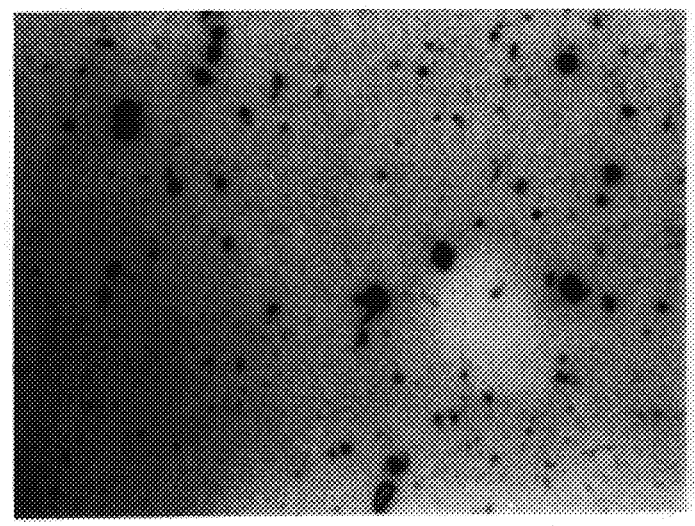
FIG. 7 is an optical microscopic picture of the surface of a film that is formed at the first time using a conventional arc-type evaporator, where the magnifying power thereof is 400.

FIG. 6 shows the condition of the surface of the film that was produced at the first time using the arc-type evaporator 40 according to the above embodiment, and FIG. 7 shows the condition of the surface of the film that was produced at the first time using the conventional arc-type evaporator 10. In both of the pictures shown in FIGS. 6 and 7, there are shown granular substances which are referred to as droplets, that is, they are lumps of cathode substances. In both cases, the droplets are small in size, which shows that, even when the arc-type evaporator 40 according to the above embodiment is used, there can be obtained the same surface roughness as the conventional arc-type evaporator 10.

Figure 8:
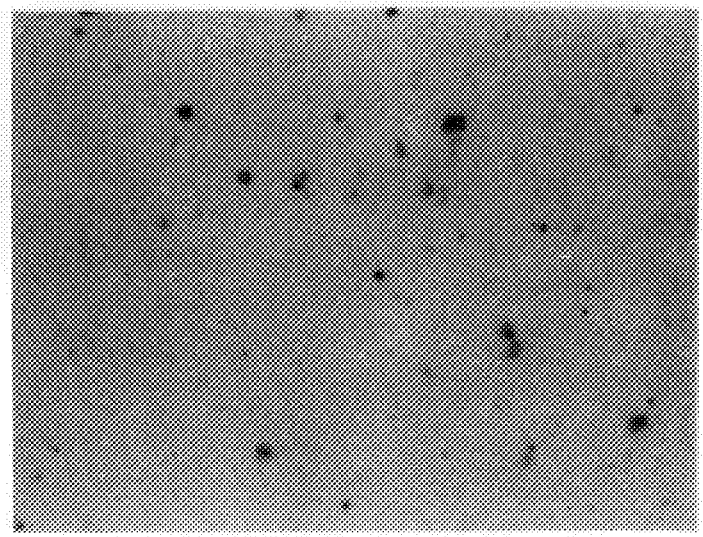
FIG. 8 is an optical microscopic picture of the surface of a film that is formed at the tenth time using an arc-type evaporator according to the invention, where the magnifying power thereof is 400.
Figure 9:
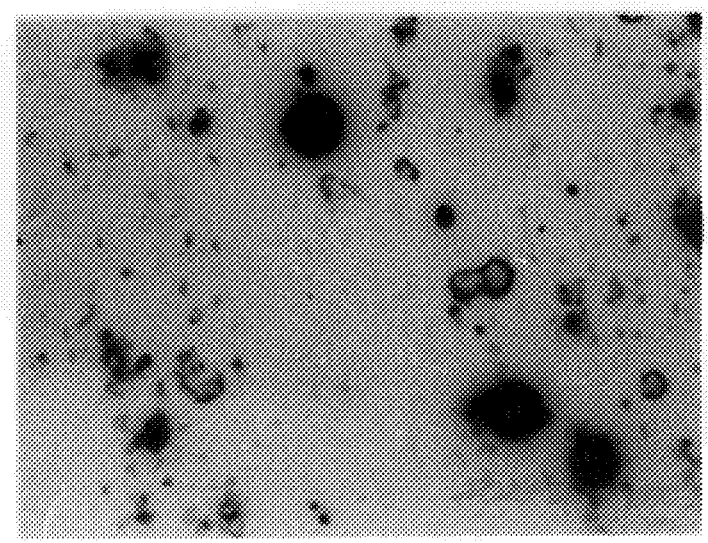
FIG. 9 is an optical microscopic picture of the surface of a film that is formed at the tenth time using a conventional arc-type evaporator, where the magnifying power thereof is 400.

Now, FIG. 8 shows the condition of the surface of the film that was produced at the tenth time using the arc-type evaporator 40 according to the above embodiment, while FIG. 9 shows the surface condition of the film that was produced at the tenth time using the conventional arc-type evaporator 10. In the case in which the arc-type evaporator 40 according to the above embodiment is used, the droplets are not different so greatly in size from those obtained at the first time (FIG. 8). On the other hand, when the conventional evaporator 10 is used, the droplets obtained are much larger in size than those obtained at the first time (FIG. 9). This tells that, if the arc-type evaporator 40 according to the above embodiment is used, then a thin film can be produced without worsening the surface roughness even if the arc-type evaporator 40 is used for a long time. That is, a thin film having a good surface roughness can be produced stably with no need to replace parts such as the trigger electrode, gas supply pipe and the like.

What is claimed is:

1. An arc-type evaporator comprising:

an anode and a cathode for generating arc discharge therebetween, said cathode having a front surface and a side portion with a periphery;

a trigger electrode for contacting said cathode to initiate an arc between said trigger electrode and said cathode;

a trigger electrode positioning system for moving said trigger electrode into and out of contact with said cathode; and a gas supply separate from said trigger electrode, for supplying a reactive gas to said cathode, said gas being disposed to react with the cathode material to produce a chemical compound, said gas supply including a ring-shaped portion encircling the periphery of the side portion of said cathode, said ring-shaped portion includes a periphery and a plurality of gas outlet ports dispersed around the periphery of said ring-shaped portion, said gas outlet ports being in flow communication with the front surface of said cathode.

2. An arc-type evaporator according to claim 1, wherein said gas outlet ports are positioned to satisfy the relations $0<Y<2D$ and $0<X<2L$, where D is the diameter of said cathode, L is the length of said cathode, Y is a distance laterally from the side portion of said cathode and X is a distance back from the front surface of said cathode.

3. An arc-type evaporator according to claim 1, further comprising a disk-like shield having an opening with an inner peripheral portion in its central portion with said cathode projecting therethrough for shielding the side portion of said cathode, said ring-shaped portion of said gas supply being located in the inner peripheral portion of said opening in said shield.

4. An arc-type evaporator according to claim 1, further comprising a mass flow controller for controlling the flow of the reactive gas emanating from said gas supply in the range of 0.01 liter/min. to 1 liter/min.

5. An arc-type evaporator according to claim 1, wherein the material forming said gas supply consists essentially of an electrical conductor and said gas supply is electrically connected to said anode through a resistor.

6. An arc-type evaporator according to claim 1, wherein the material forming said gas supply consists essentially of an electrical insulator.

7. An arc-type evaporator according to claim 1, further comprising a magnet which is disposed adjacent to a back surface of said cathode, wherein said gas supply consists essentially of a non-magnetic material.

8. An arc-type evaporator according to claim 1, wherein said gas outlet ports of gas supply are positioned to satisfy the relations $0<Y<2D$ and $-L<X<L$, where D is the diameter of said cathode, L is the length of said cathode, Y is a distance laterally from the side portion of said cathode and X is a distance back from the front surface of said cathode.

* * * * *